United States Patent
Kim et al.

(10) Patent No.: US 9,886,154 B2
(45) Date of Patent: Feb. 6, 2018

(54) FLEXIBLE DISPLAY DEVICE (71) Applicant: Samsung Display Co., Ltd., Yongin-si (KR)

(72) Inventors: Kyungseop Kim, Hwaseong-si (KR); Sungkyun Park, Suwon-si (KR); Sangkyu Choi, Daejeon (KR); Sangyoun Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 60 days.

(21) Appl. No.: 15/045,993

(22) Filed: Feb. 17, 2016

(65) Prior Publication Data

US 2016/0364044 A1    Dec. 15, 2016

(30) Foreign Application Priority Data

Jun. 10, 2015    (KR) .................. 10-2015-0082141

(51) Int. Cl.
*G06F 3/041*    (2006.01)
*G06F 3/044*    (2006.01)
*H01L 27/32*    (2006.01)
*H01L 51/00*    (2006.01)
*G06F 1/16*    (2006.01)

(52) U.S. Cl.
CPC ............ *G06F 3/044* (2013.01); *H01L 27/323* (2013.01); *H01L 51/0097* (2013.01); *G06F 1/1652* (2013.01); *G06F 2203/04102* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 9,207,818 B2 | 12/2015 | Kang et al. | |
| 9,229,563 B2 | 1/2016 | Park | |
| 2013/0300678 A1* | 11/2013 | Kang | ............ G06F 3/044 345/173 |
| 2014/0054070 A1 | 2/2014 | Ichiki | |
| 2017/0042042 A1* | 2/2017 | Marino | ............... B23K 3/0471 |

FOREIGN PATENT DOCUMENTS

| | | |
|---|---|---|
| KR | 1020130014261 | 2/2013 |
| KR | 1020140051135 | 4/2014 |
| KR | 1020140064259 | 5/2014 |
| KR | 101455287 | 10/2014 |
| KR | 1020140128267 | 11/2014 |
| KR | 101469146 | 12/2014 |
| KR | 101493412 | 2/2015 |

* cited by examiner

*Primary Examiner* — Joseph Haley
(74) *Attorney, Agent, or Firm* — H.C. Park & Associates, PLC (57) ABSTRACT

A flexible display device including a display panel and a touch panel, and the touch panel includes touch sensors and signal lines. A signal line crossing a folding axis of the signal lines includes a first part and a signal pattern and the signal pattern includes a connection line substantially in parallel with the folding axis.

19 Claims, 10 Drawing Sheets

FLEXIBLE DISPLAY DEVICE

CROSS-REFERENCE TO RELATED APPLICATION

This application claims priority from and the benefit of Korean Patent Application No. 10-2015-0082141, filed on Jun. 10, 2015, which is hereby incorporated by reference for all purposes as if fully set forth herein.

BACKGROUND

Field

Exemplary embodiments of the present invention relate to a flexible display device, and more particularly, to a flexible display device including a touch panel.

Discussion of the Background

A variety of display devices are used for multi-media devices, such as televisions, mobile phones, tablet computers, navigations, game machines, etc. These display devices may include a keyboard or a mouse as an input device. In addition, display devices that have recently been developed may also include a touch panel as an input device thereof.

In addition to existing flat display devices, a variety of other types of display devices have recently been developed. A variety of types of flexible display devices, such as curved display devices, bending type display devices, foldable display devices, rollable display devices, and stretchable display devices have been developed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible display device including a touch panel in which defects are reduced.

Exemplary embodiments also provide a flexible display device including a foldable area foldable about a folding axis and a non-foldable area. The flexible display device includes a display panel configured to display an image and a touch panel on the display panel.

Additional aspects will be set forth in the detailed description which follows, and, in part, will be apparent from the disclosure, or may be learned by practice of the inventive concept.

An exemplary embodiment discloses a flexible display device including a foldable area configured to be foldable about a folding axis, and a non-foldable area; a display panel configured to display an image; and a touch panel disposed on the display panel. The touch panel includes touch sensors and signal lines respectively connected to ends of the touch sensors. At least one of the signal lines crossing the folding axis includes a first part connected to one end of a corresponding touch sensor of the touch sensors and at least one signal pattern connected to the first part and disposed on the foldable area. The signal pattern includes sub-lines connected to the first part and a connection line substantially in parallel with the folding axis and connecting the sub-lines to each other.

An exemplary embodiment also discloses a flexible display device including a foldable area configured to be foldable about a folding axis extending in a direction, and a non-foldable area; a display panel configured to display an image; and a touch panel disposed on the display panel. The touch panel includes first touch sensors and second touch sensors, and first signal lines and second signal lines respectively connected to ends of the first and second touch sensors. Each of the first and second signal lines includes a first part connected to a corresponding touch sensor and at least one signal pattern connected to the first part and disposed on the foldable area. The signal pattern includes sub-lines connected to the first part and a connection line substantially parallel to the folding axis and connecting the sub-lines to each other, wherein each of the first and second sub-lines crosses the folding axis.

An exemplary embodiment also discloses a flexible display device including a foldable area configured to be foldable about a folding axis, and a non-foldable area; a display panel configured to display an image; and a touch panel disposed on the display panel. The touch panel includes touch sensors and signal lines respectively connected to ends of the touch sensors. At least one signal line crossing the folding axis of the signal lines includes a first part connected to one end of a corresponding touch sensor from among the touch sensors; and at least one signal pattern connected to the first part and disposed on the foldable area. The signal pattern includes a polygonal line connected to the first part and a connection line connecting one side and the other side of the polygonal line to each other and forming an angle of about 30 degrees or less with the folding axis.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1A:
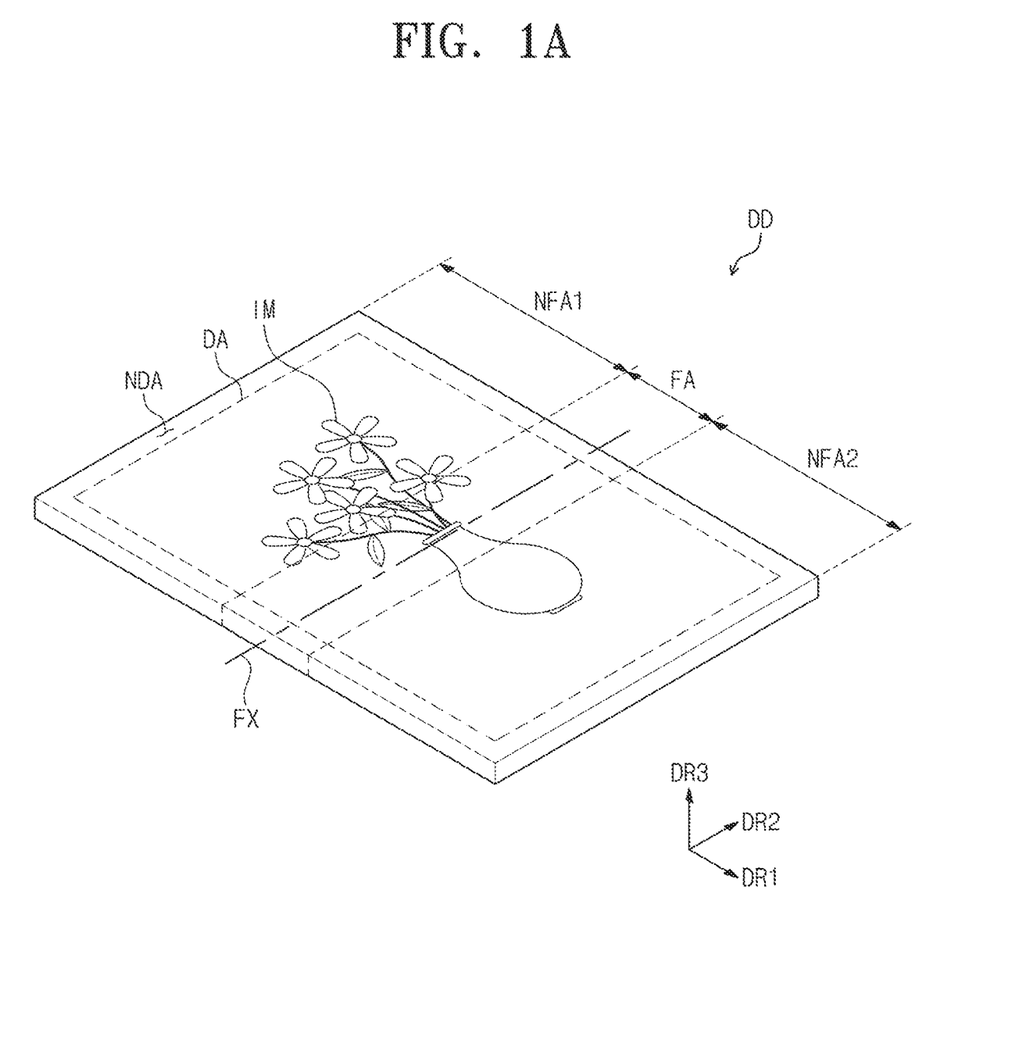
FIG. 1A and FIG. 1B are perspective views of a flexible display device according to an exemplary embodiment of the inventive concept.
Figure 1B:
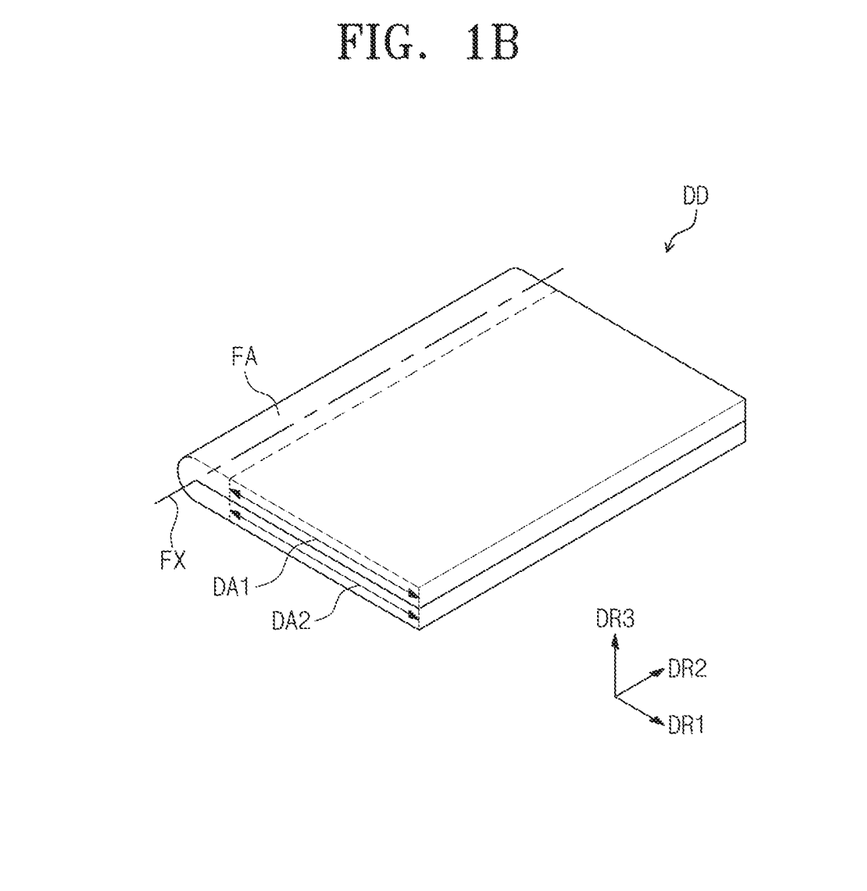

FIGS. 1A and 1B are perspective views of a flexible display device DD according to an exemplary embodiment. In this exemplary embodiment, a foldable display device is exemplarily illustrated as an example of a flexible display device DD. However, the inventive concept is not limited thereto. In another exemplary embodiment, the display device may be a curved display device, a banding type display device, a foldable display device, a rollable display device, or a stretchable display device. Although not separately illustrated, a display device according to the inventive concept may be used for small and medium-sized electronic devices, such as a mobile phone, a personal computer, a notebook computer, a personal digital assistant, a car navigation unit, a game machine, a portable electronic device, a wrist-watch type electronic device, and a camera, as well as larger electronic devices, such as a television or an external billboard.

As illustrated in FIGS. 1A and 1B, a display surface configured to display an image IM is parallel to a surface defined by a first direction DR1 and a second direction DR2. A third direction DR3 indicates a direction normal to the display surface. A thickness direction of the flexible display device DD is defined in the third direction DR3. A front surface and a rear surface of each of the members are divided by the third direction DR3. However, the directions indicated by the directions DR1, DR2, and DR3 are relative concepts, and may thus be converted into other directions.

As illustrated in FIG. 1, the display device DD includes a plurality of divided areas on the display surface thereof. The display device DD may be divided into a display area DA and a non-display area NDA according to whether an image IM is displayed. The display area DA is an area configured to display an image, and the non-display area NDA is an area which is adjacent to the display area DA and does not display an image. As an example, the display area DA may have a rectangular shape. The non-display area NDA may surround the display area DA. The display device DD may be divided according to the operation thereof into a foldable area FA foldable along a folding axis FX, and a first non-foldable area NFA1 and a second non-foldable area NFA2 which are not foldable.

Figure 2A:
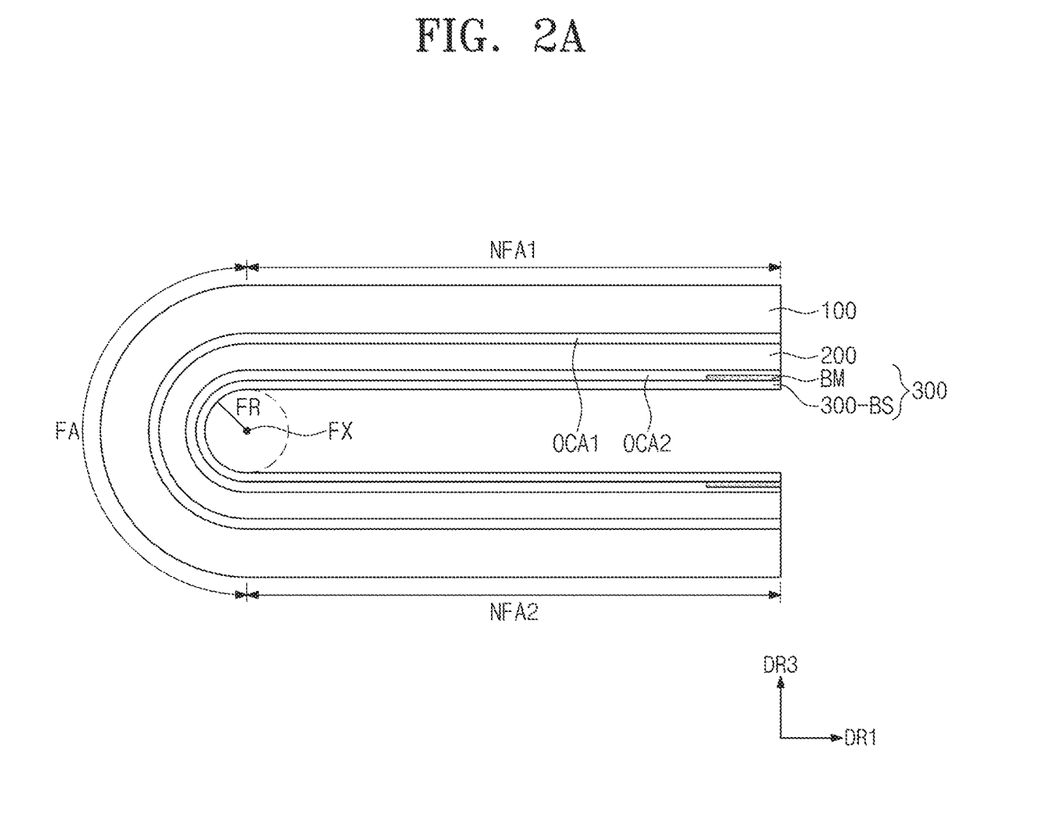
FIG. 2A and FIG. 2B are enlarged cross-sectional views of a flexible display device according to an exemplary embodiment of the inventive concept.
Figure 2B:
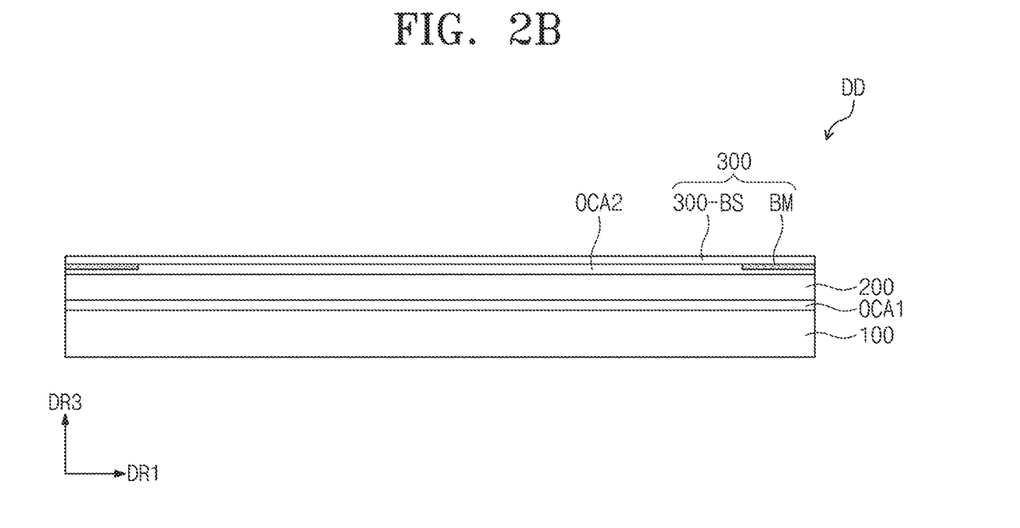

FIGS. 2A and 2B are enlarged cross-sectional views of a display device DD according to an exemplary embodiment of the inventive concept. As illustrated in FIG. 2A, the display device DD may be folded along the folding axis FX so that display surfaces of the first and second non-foldable areas NFA1 and NFA2 face each other. Hereinafter, display surfaces of different areas that are folded so as to face each other are referred to as "inner folding". In this exemplary embodiment, since the first non-foldable area NFA1 is rotated in a clockwise direction along the folding axis FX, the foldable display device may be a case of inner folding. Although not separately illustrated, the display device DD may be folded along the folding axis FX so that the display surfaces of the first and second non-foldable areas NFA1 and NFA2 are disposed towards an outside. Hereinafter, such a case will be referred to as "outer folding", in which display surfaces of different areas are folded so as to be disposed towards an outside.

As illustrated in FIGS. 2A and 2B, the display device DD includes a display panel 100, a touch panel 200, and a window member 300. Although not separately illustrated, the display device DD may further include a protective member bonded to the window member 300 to protect the display panel 100 and the touch panel 200. Each of the display panel 100, the touch panel 200, and the window member 300 may be flexible.

The display panel 100 generates an image IM (see FIG. 1A) corresponding to an input image data. The display panel 100 may be a liquid crystal display panel, an organic light emitting display panel, an electrophoretic display panel, an electrowetting display panel, or the like, but a type of the display panel 100 is not limited thereto. In an exemplary embodiment of the inventive concept, an organic light emitting display panel is described as an example. Details about the organic light emitting display panel will be described below.

The touch panel 200 obtains coordinate information of an input point. The touch panel 200 may be disposed on a front surface of the display panel 100. However, a positional relationship between the display panel 100 and the touch panel 200 is not limited thereto. The touch panel 200 may be a contact or non-contact type touch panel. Details about the touch panel 200 will be described below.

The window member 300 may include a base member 300-BS and a black matrix BM. The black matrix BM may be disposed on a rear surface of the base member 300-BS to define a bezel area, i.e., the non-display area NDA (see FIG. 1A) of the display device DD. The base member 100-BS may include a glass substrate, a sapphire substrate, a plastic film, and the like. The black matrix BM is a colored organic layer and may be formed by, for example, a coating process. Although not separately illustrated, the window member 300 may further include a functional coating layer disposed on a front surface of the base member 300-BS. The functional coating layer may include an anti-fingerprint layer, an anti-reflection layer, and a hard coating layer.

The display panel 100 and the touch panel 200 may be bonded to each other by an optically clear adhesive film OCA1. The touch panel 200 and the window member 300 may also be bonded to each other by an optically clear adhesive film OCA2. In an exemplary embodiment of the inventive concept, either one of the two optically clear adhesive films OCA1 and OCA2 may be omitted. For example, because the display panel 100 and the touch panel 200 are manufactured in a continuous process, the touch panel 200 may be directly disposed on the display panel 100.

Figure 3:
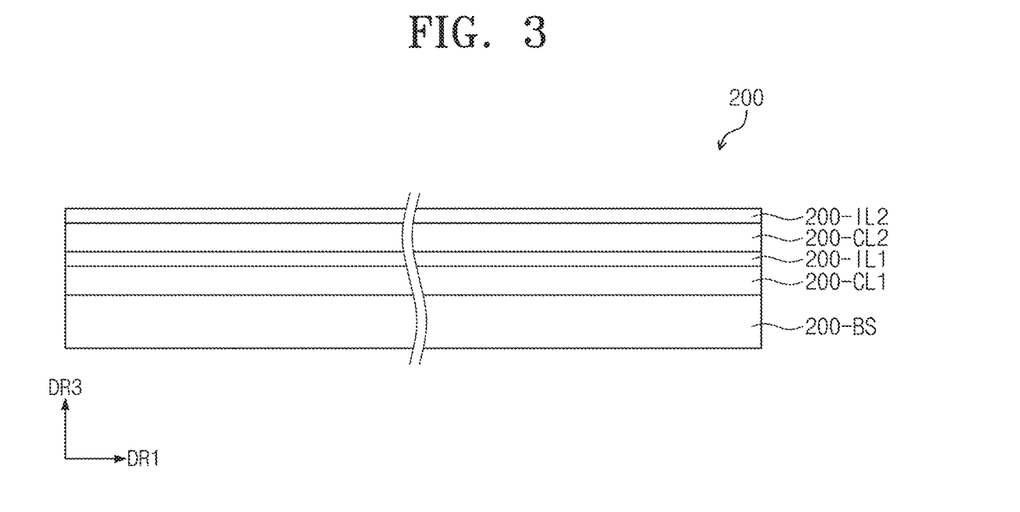
FIG. 3 is a cross-sectional view of a touch panel according to an exemplary embodiment of the inventive concept.
Figure 4:
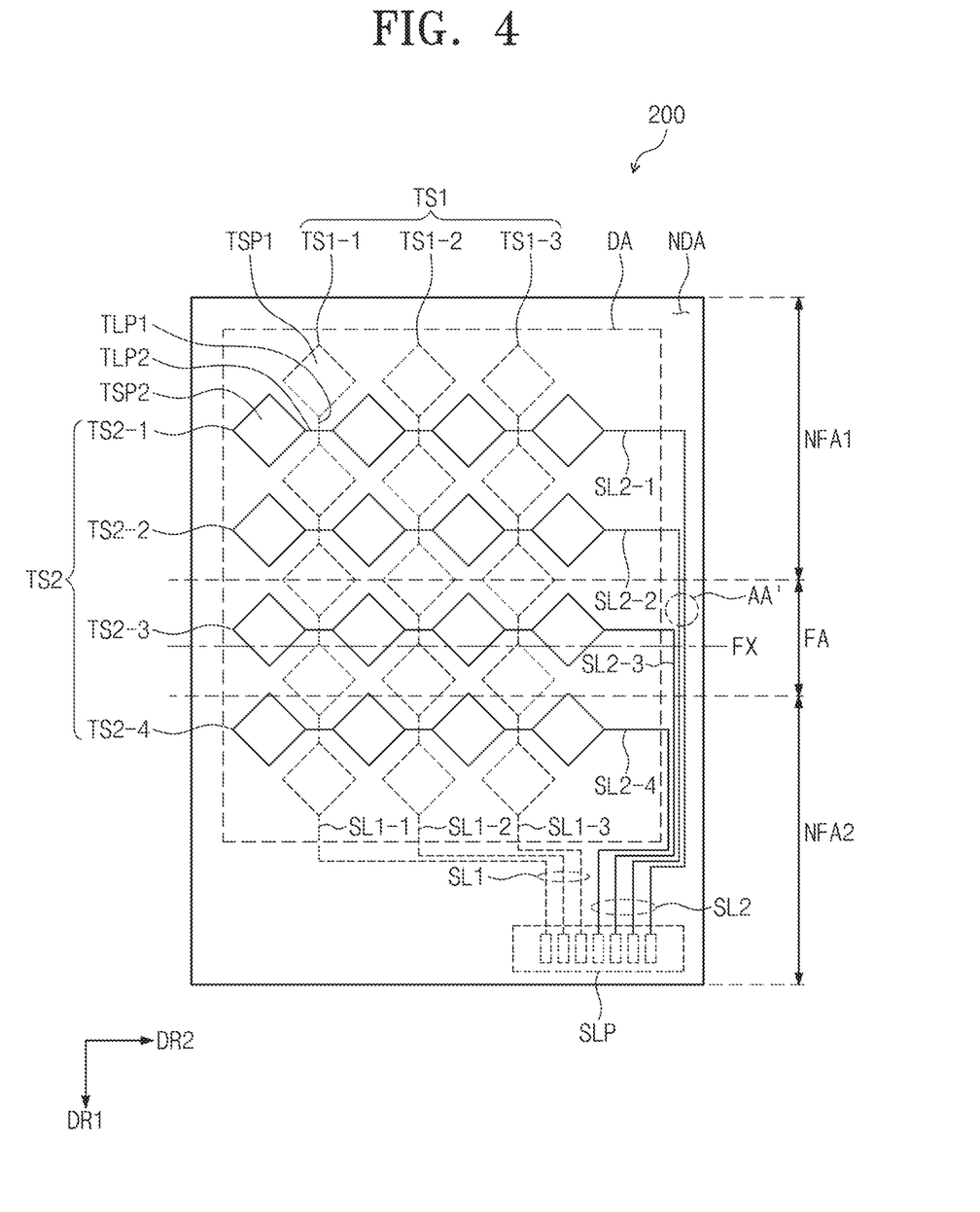
FIG. 4 is a plan view of a touch panel according to an exemplary embodiment of the inventive concept.

FIG. 3 is a cross-sectional view of a touch panel 200 according to an exemplary embodiment of the inventive concept and FIG. 4 is a plan view of a touch panel 200 according to an exemplary embodiment of the inventive concept.

Referring to FIG. 3, the touch panel 200 includes a base member 200-BS, a first conductive layer 200-CL1, a first insulating layer 200-IL1, a second conductive layer 200-CL2, and a second insulating layer 200-IL2. In this exemplary embodiment, the first conductive layer 200-CL1, the first insulating layer 200-IL 1, the second conductive layer 200-CL2, and the second insulating layer 200-IL2 may be sequentially stacked on the base member 200-BS.

In this exemplary embodiment, the touch panel 200 may be a capacitive touch panel. The touch panel 200 may be acceptable if it includes two types of sensors crossing each other regardless of the types of the sensors. The capacitive touch panel may obtain coordinate information of a touched point using a self capacitance method or a mutual capacitance method.

The first conductive layer 200-CL1 may include a transparent conductive oxide, e.g., indium tin oxide (ITO), indium zinc oxide (IZO), zinc oxide (ZnO), or indium tin zinc oxide (ITZO). The first conductive layer 200-CL1 may include a metal, such as molybdenum, silver, titanium, copper, aluminum, or an alloy thereof. The first conductive layer 200-CL1 may include PEDOT, a metal nano-wire, or graphene. The first conductive layer 200-CL1 may include a first layer including any one of the aforementioned materials, a second layer including another material, and other layers.

The first conductive layer 200-CL1 may include a plurality of conductive patterns disposed on one surface of the base member 200-BS. The plurality of conductive patterns may configure touch sensors and signal lines to be described below. The touch sensors and/or signal lines may include a plurality of conductive lines. The plurality of conductive lines may be formed by patterning the first conductive layer 200-CL1 by a photolithography process, or the like.

The first conductive layer 200-CL1 may protect the plurality of conductive patterns or may insulate some conductive patterns and other conductive patterns of the plurality of conductive patterns from each other. The first insulating film 200-IL1 may include an inorganic film or an organic film. The first insulating film 200-IL1 may have a multi-layer structure and may include at least one inorganic film and at least one organic film.

The second conductive layer 200-CL2 may include a transparent conductive oxide. The second conductive layer 200-CL2 may have a single-layer structure or a multi-layer structure. The second conductive layer 200-CL2 may include a plurality of conductive patterns.

The second insulating layer 200-IL2 may protect the second conductive layer 200-CL2. The second insulating layer 200-IL2 may include an inorganic film or an organic film. The second insulating layer 200-IL2 may have a multi-layer structure and may include at least one inorganic film and at least one organic film.

In an exemplary embodiment of the inventive concept, the second insulating film 200-IL2 may be omitted. Further, in an exemplary embodiment of the inventive concept, positions of the first and second conductive layers 200-CL1 and 200-CL2 may be interchanged with each other.

As illustrated in FIG. 4, the touch panel 200 may include first touch sensors TS1-1 to TS1-3 (hereinafter, TS1) formed on the first conductive layer 200-CL1, and second touch sensors TS2-1 to TS2-4 (hereinafter, TS2) formed on the second conductive layer 200-CL2.

The first touch sensors TS1 may extend along the first direction DR1 and may be arranged along the second direction DR2. The second touch sensors TS2 may extend along the second direction DR2 and may be arranged along the first direction DR1. The second touch sensors TS2 may cross and insulated from the first touch sensors TS1.

FIG. 4 exemplarily illustrates three of the first touch sensors TS1 and four of the second touch sensors TS2. The first and second touch sensors TS1 and TS2 are disposed overlapping most of the display area DA.

The first touch sensors TS1 include first sensor patterns TSP1 arranged in the first direction DR1 and first connection patterns TLP1 connecting two adjacent first sensor patterns TSP1 to each other from among the first sensor patterns TSP1. The first sensor patterns TSP1 and the first connection patterns TLP1 may be integrated. In addition, although not illustrated, the first sensor patterns TSP1 and the first connection patterns TLP1 may have a mesh shape.

The second touch sensors TS2 include second sensor patterns TSP2 arranged in the second direction DR2 and second connection patterns TLP2 connecting two adjacent second sensor patterns to each other from among the second sensor patterns TSP2. The second connection patterns TSP2 are respectively disposed crossing and insulated from the corresponding first connection patterns TSP1. The second sensor patterns TSP2 and the second connection patterns TLP2 may be integrated. In addition, although not illustrated, the second sensor patterns TSP2 and the second connection patterns TLP2 may have a mesh shape.

The touch panel 200 may further include signal lines. The signal lines include first signal lines SL1-1 to SL1-3 (hereinafter, SL1) and second signal lines SL2-1 to SL2-4 (hereinafter, SL2). The first signal lines SL1 are respectively connected to ends of the first touch sensors TS1, and the second signal lines SL2 are respectively connected to ends of the second touch sensors TS2. The first and second signal lines SL1 and SL2 are disposed overlapping most of the non-display area NDA.

At least one of the first and second signal lines SL1 and SL2 crosses the folding axis FX. Although FIG. 4 illustrates that three signal lines SL2-1 to SL2-3 of the second signal lines SL2 cross the folding axis FX, the inventive concept is not limited thereto.

The touch panel 200 includes signal pads SLP respectively correspondingly connected to the first and second signal lines SL1 and SL2. The signal pads SLP are respectively connected to the corresponding first and second touch sensors TS1 and TS2 through the first and second signal lines SL1 and SL2.

Figure 5:
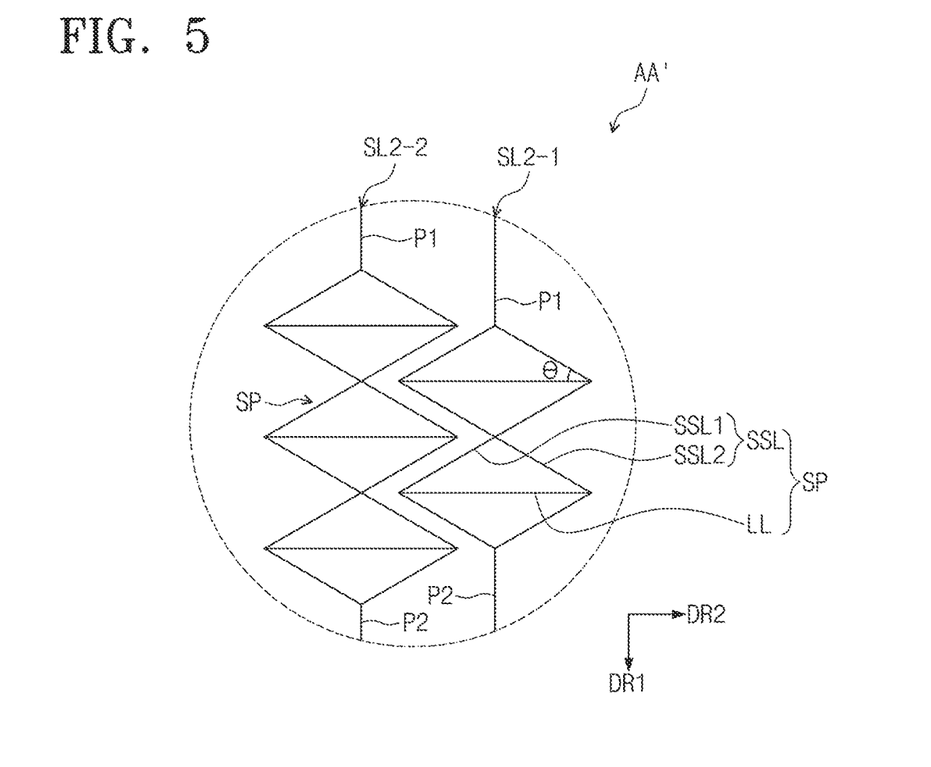
FIG. 5 is an enlarged view of portion AA' of FIG. 4.
Figure 6:
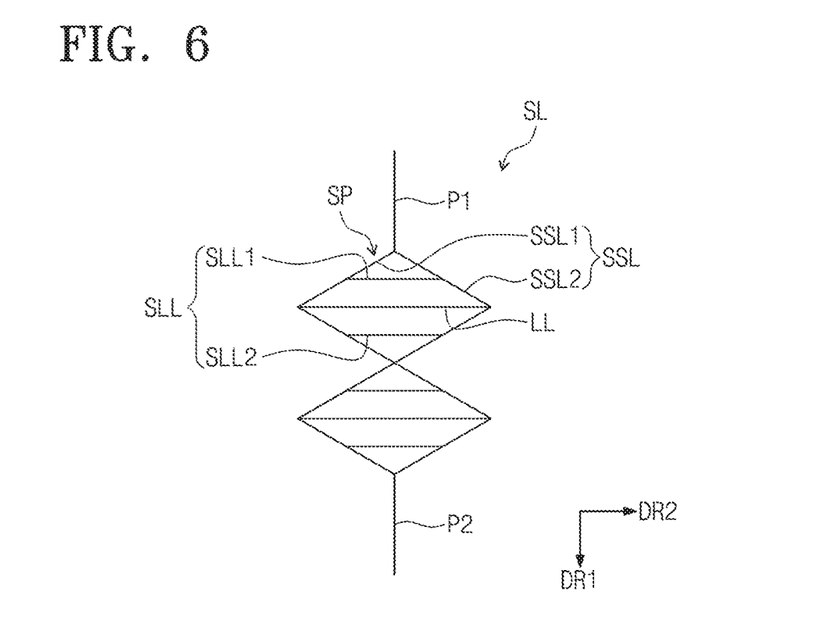
FIG. 6, FIG. 7, and FIG. 8 are enlarged plan views of a portion of a signal line passing through a folding area.
Figure 7:
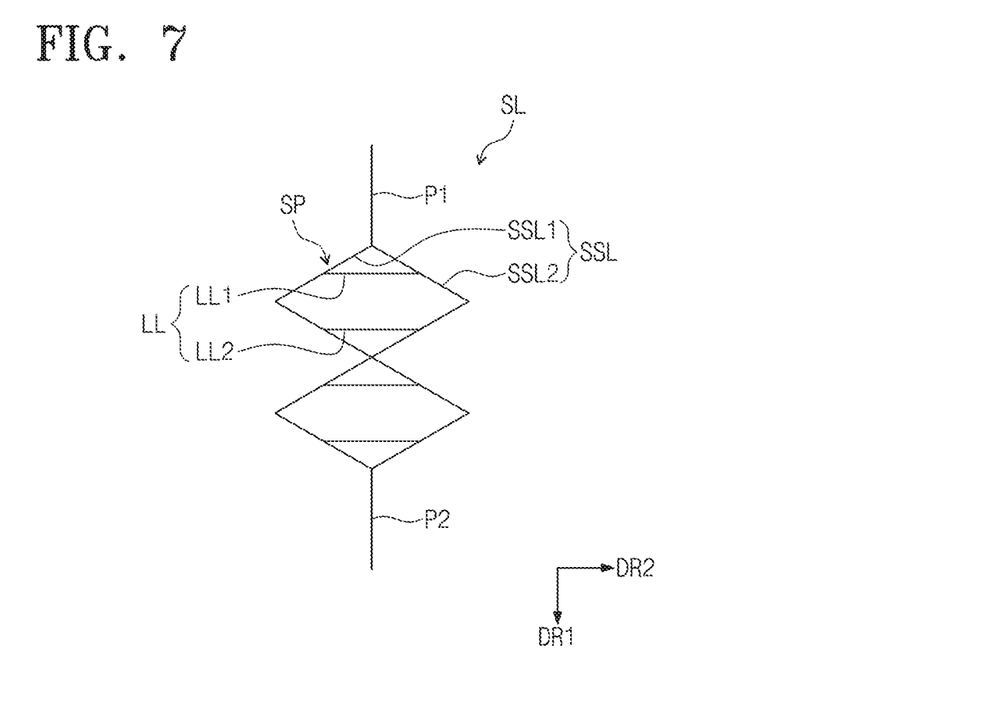
Figure 8:
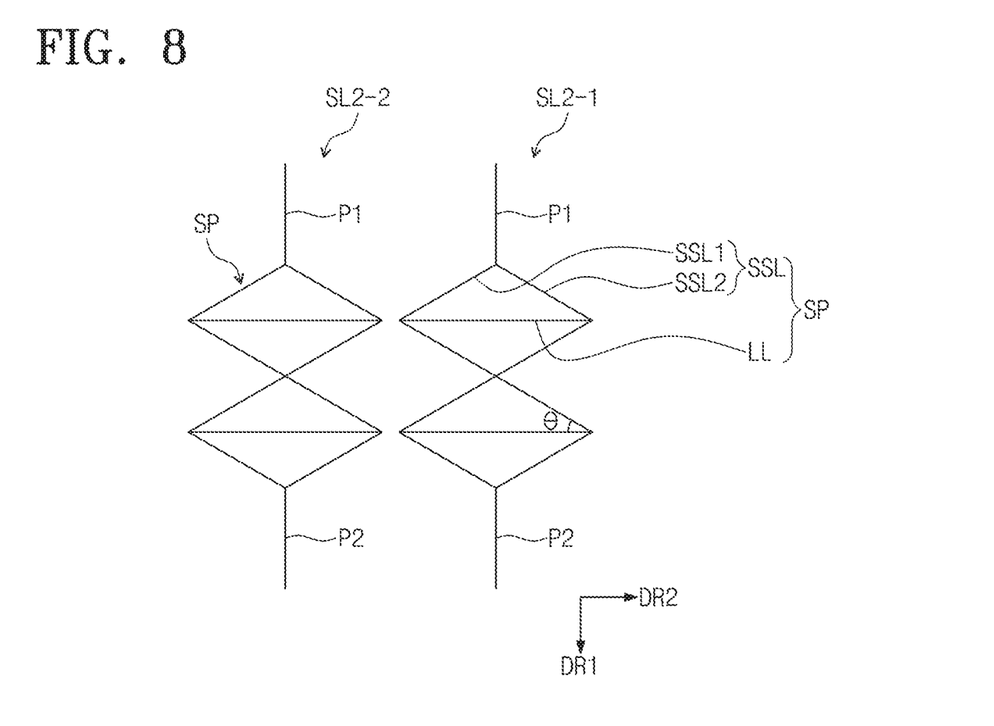

FIG. 5 illustrates an enlarged view of portion AA' of FIG. 4, and illustrates an enlarged view of a portion of two signal lines SL2-1 and SL2-2 (hereinafter, "first signal line" and "second signal line") crossing the folding axis FX. FIGS. 6 to 8 illustrate enlarged plan views of a portion of a signal line passing through the folding area FA.

First, referring to FIGS. 4 and 5, the first and second signal lines SL2-1 and SL2-2 are connected to the corresponding first and second touch sensors TS2-1 and TS2-2 of the second touch sensors TS2. The first and second signal lines SL2-1 and SL2-2 include a first part P1, a second part P2, and a signal pattern SP disposed on the foldable area FA.

The first part P1 of the first signal line SL2-1 connects the first touch sensor TS2-1 and the signal pattern SP of the first signal line SL2-1 to each other, and the first part P1 of the second signal line SL2-2 connects the second touch sensor TS2-2 and the signal pattern SP of the second signal line SL2-2 to each other.

The second part P2 of the first signal line SL2-1 connects the signal pattern SP of the first signal line SL2-1 and one of the signal pads SLP corresponding to the first signal line SL2-1 to each other. The second part P2 of the second signal line SL2-2 connects the signal pattern SP of the second signal line SL2-2 and one of the signal pads SLP corresponding to the second signal line SL2-2 to each other.

The first and second signal lines SL2-1 and SL2-2 may include at least one signal pattern SP. The signal pattern SP includes sub-lines SSL and a connection line LL.

Each of the sub-lines SSL connects the first part P1 and the second part P2 to each other. Each of the sub-lines SSL may have a shape having at least one bent portion. The sub-lines SSL may be symmetrical to each other about an axis that is an extending direction of the first and second parts P1 and P2. The sub-lines SSL may be arranged forming a polygonal shape. When the sub-lines SSL have a shape having an infinite number of bent portions, the sub-lines SSL may be disposed to form a circle.

In FIG. 5, the sub-lines SSL include first and second sub-lines SSL1 and SSL2 connected to each other. Each of the first and second sub-lines SSL1 and SSL2 may have shapes that have one bent portion. The first and second sub-lines SSL1 and SSL2 may be arranged in a rhombus shape.

The connection line LL is disposed between the sub-lines SSL to connect the sub-lines SSL to each other. One end of the connection line LL is connected to a portion of the first sub-line SSL1, and the other end opposing the one end of the connection line LL is connected to a portion of the second sub-line SSL2. Although FIG. 5 illustrates that the connection line LL is connected to each of bent points of the first and second sub-lines SSL1 and SSL2, the inventive concept is not limited thereto.

In an exemplary embodiment of the inventive concept, the connection line LL may be disposed substantially parallel to the folding axis FX. That is, the connection line LL may be disposed forming an angle of about 30 degrees or less with the folding axis FX. When the connection line LL is disposed substantially parallel to the folding axis FX, an acute angle formed by the connection line LL and the sub-lines SSL may range from about 10 degrees to about 30 degrees.

As illustrated in FIG. 6, in an exemplary embodiment of the inventive concept, a signal pattern SP included in one signal line SL passing through the folding axis FX may further include a sub-connection line SLL disposed spaced apart from a connection line LL. The sub-connection line SLL is disposed substantially parallel to the connection line LL and may connect the sub-lines SSL to each other.

Although FIG. 6 illustrates that the sub-connection line SLL includes first and second sub-connection lines SLL1 and SLL2 disposed facing each other with the connection line LL therebetween, the inventive concept is not limited thereto. In another exemplary embodiment, one or two or more sub-connection lines may be provided as necessary.

As illustrated in FIG. 7, in an exemplary embodiment of the inventive concept, a connection line LL may include a first connection line LL1 and a second connection line LL2, which are disposed spaced apart from each other by a predetermined distance. The first and second connection lines LL1 and LL2 are disposed parallel to each other and connect the sub-lines SSL to each other.

Again referring to FIGS. 5 and 8, each of first and second signal lines SL2-1 and SL2-2 may include a plurality of signal patterns SP. The plurality of signal patterns SP may be arranged side-by-side in an extension direction of each of the first and second signal lines SL2-1 and SL2-2.

As illustrated in FIG. 5, the plurality of signal patterns SP of the first signal line SL2-1 and the plurality of signal patterns SP of the second signal line SL2-2 may be alternately arranged to be engaged with each other. That is, one signal pattern SP of the plurality of signal patterns SP of the first signal line SL2-1 may be arranged between two adjacent signal patterns SP of the second signal lines SL2-2.

However, the inventive concept is not limited thereto, and, as illustrated in FIG. 8, the plurality of signal patterns SP of the first and second signal lines SL2-1 and SL2-2 corresponding to each other may be disposed on the same line.

In related art, since signal lines crossing the folding axis are repeatedly folded, a crack may occur, so that a portion of the signal lines may be disconnected. However, since the signal lines according to an exemplary embodiment of the inventive concept may include the connection line substantially parallel to the folding axis, signals may be delivered through the connection line even when a portion of the signal lines is disconnected as a result of repeated folding of the signal lines. In addition, because an acute angle formed by the connection line and the sub-lines is designed to be about 30 degrees, the curvature characteristic of the signal lines may be enhanced.

Figure 9:
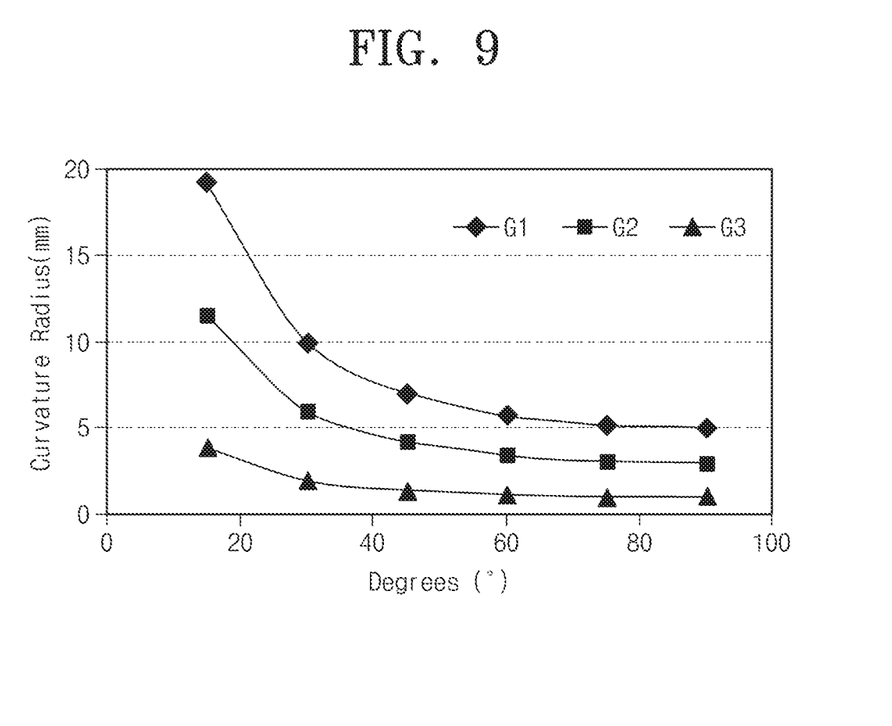
FIG. 9 is a graph of a curvature radius of a signal line according to an angle formed by a folding axis and a signal line.

FIG. 9 shows a graph showing a curvature radius of a signal line according to an angle formed by a folding axis and a signal line.

Referring to FIG. 9, a first curve G1 is a situation in which a minimum curvature radius applied to the signal line is 5 mm, a second curve G2 is a graph when a minimum curvature radius applied to the signal line is 3 mm, and a third curve G3 is a graph when a minimum curvature radius applied to the signal line is 1 mm.

When the signal line and the folding axis are perpendicular to each other, the signal line is folded to have a minimum curvature radius. At this time, the signal line is subjected to a maximum curvature. Meanwhile, when an angle formed by the signal line and the folding axis gradually decreases to less than about 90 degrees, a curvature radius of the folded signal line gradually increases to a value more than the minimum curvature radius.

Referring to the second curve G2 in FIG. 9, when the signal line and the folding axis forms an angle of about 30 degrees, the curvature radius of the folded signal line is about 5 mm, which is greater than the curvature radius of 3 mm for the folded signal line when the signal line and the folding axis form the angle of about 90 degrees. Accordingly, a curvature stress applied to the signal line when the signal line and the folding axis form the angle of about 30 degrees is less than that when the signal line and the folding axis form an angle of about 90 degrees. As a result, the curvature characteristic of the signal line when the signal line and the folding axis form the angle of about 30 degrees may be made to be greater than that when the signal line and the folding axis form the angle of about 90 degrees.

Figure 10:
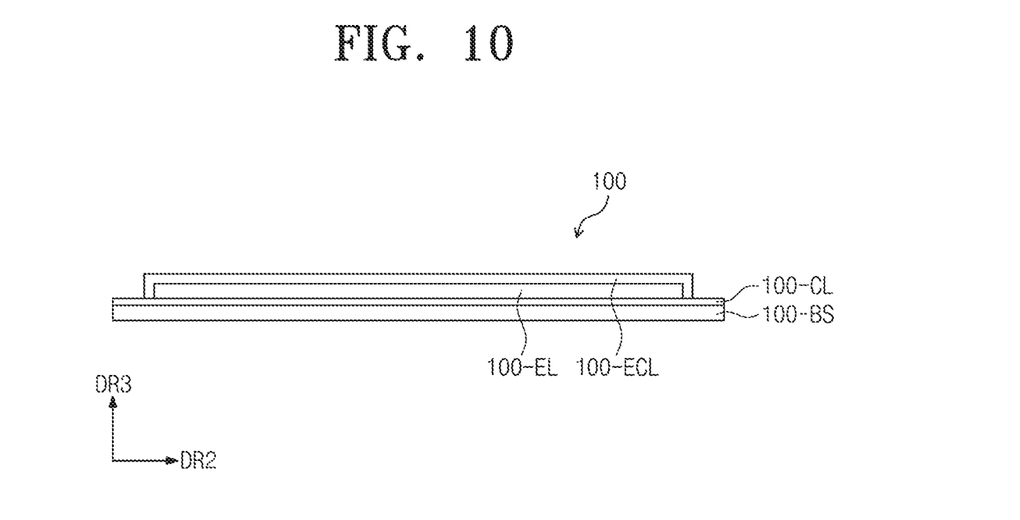
FIG. 10 is an enlarged cross-sectional view of a display panel.
Figure 11:
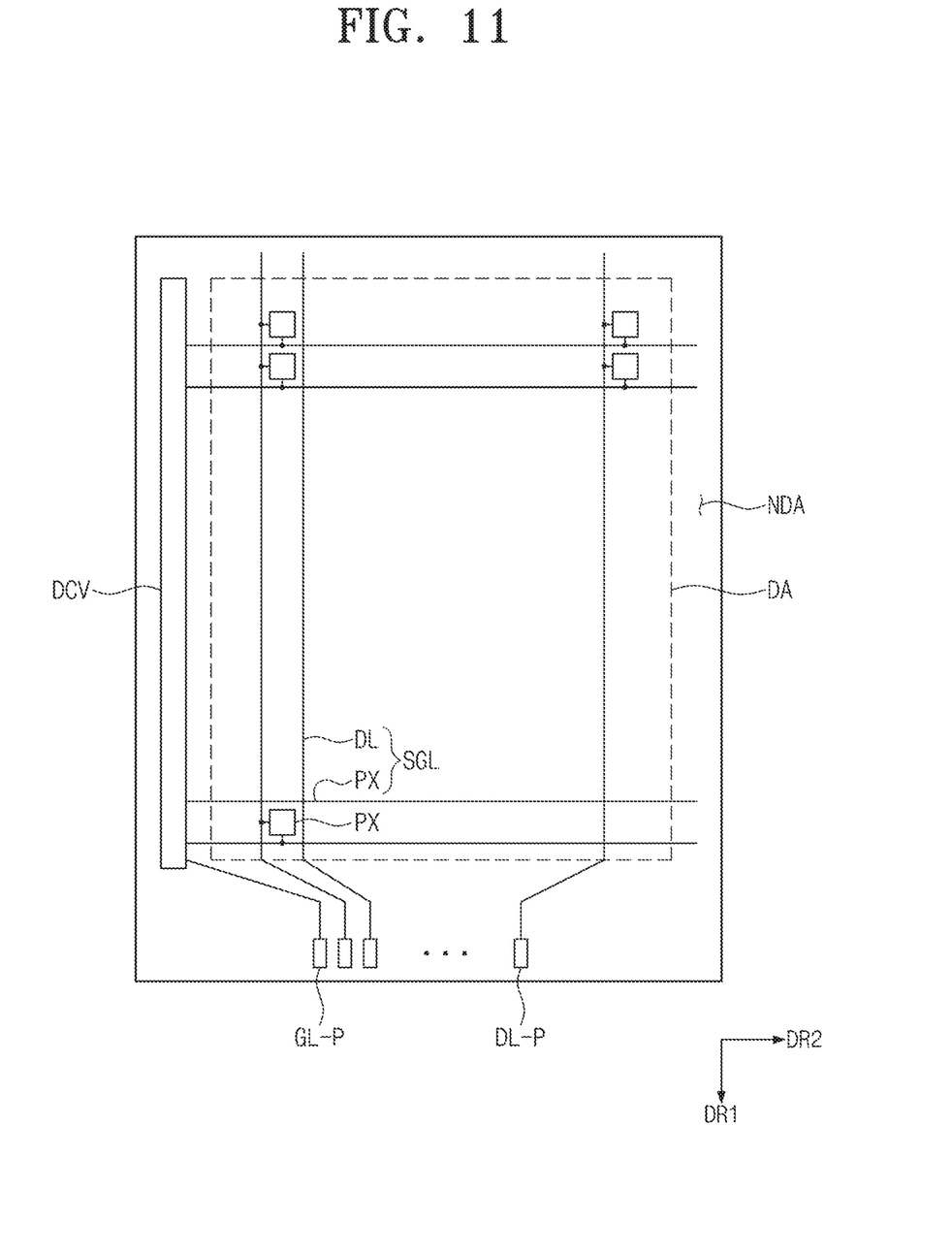
FIG. 11 is a plan view of a display panel according to an exemplary embodiment of the inventive concept.
Figure 12:
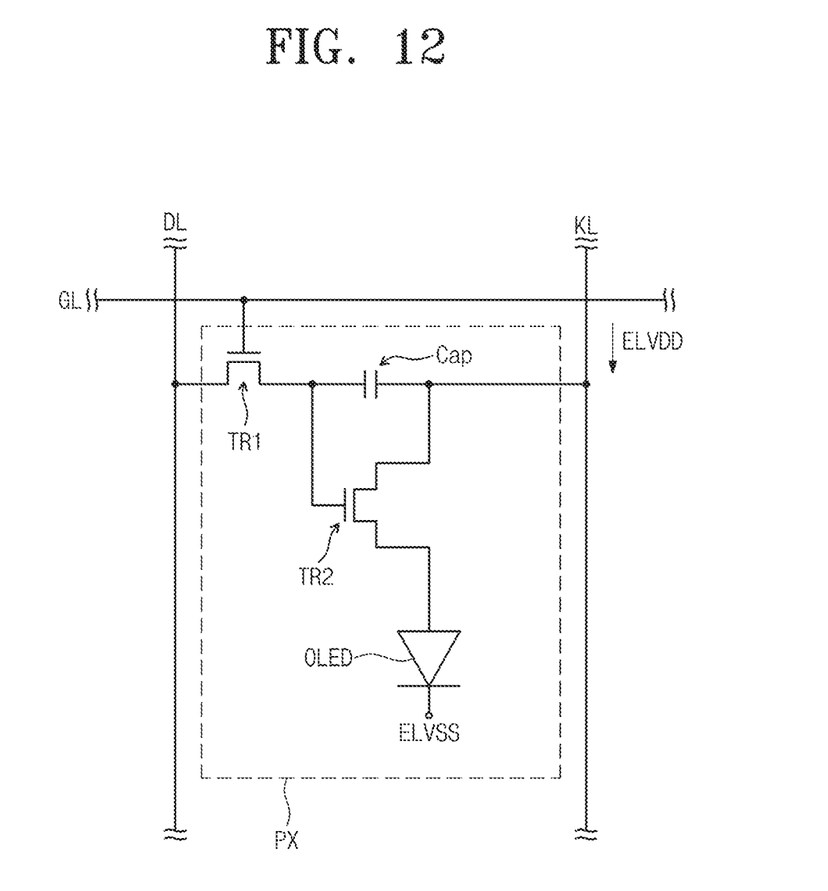
FIG. 12 is an equivalent circuit diagram of a pixel according to an exemplary embodiment of the inventive concept.

FIG. 10 is an enlarged cross-sectional view of a display panel 100. FIG. 11 is a plan view of a display panel 100 according to an exemplary embodiment of the inventive concept. FIG. 12 is an equivalent circuit diagram of a pixel PX according to an exemplary embodiment of the inventive concept. Hereinafter, a display panel 100 according to an exemplary embodiment of the inventive concept will be described with reference to FIGS. 10 to 12.

As illustrated in FIG. 10, the display panel 100 may include a base member 100-BS, a circuit layer 100-CL, a device layer 100-EL, and an encapsulation layer 100-ECL. Although not separately illustrated, the display panel 100 may further include an optical member disposed on the encapsulation layer 100-ECL, for example, a phase delay plate and a polarizer.

The base member 100-BS may include at least one plastic film. The base member 100-BS may include two plastic films, and inorganic films, a silicon nitride film, and/or a silicon oxide film, which are disposed between the two plastic films. The base member 100-BS may include at least one of polyimide (PI), polyethyleneterephthalate (PET), polyethylenenaphthalate (PEN), polyethersulphone (PES), or fiber reinforced plastics (FRP).

The circuit layer 100-CL includes a plurality of signal lines SGL and other electronic devices which are provided in the display panel 100. In addition, the circuit layer 100-CL includes a plurality of insulating layers insulating the signal lines SGL and configurations of the electronic devices.

As illustrated in FIGS. 11 and 12, the circuit layer 100-CL may include a plurality of signal lines SGL. The plurality of signal lines SGL may include gate lines GL arranged along a second direction DR2 and data lines DL arranged along a first direction DR1. The gate lines GL and the data lines DL are respectively connected to a corresponding pixel PX of the plurality of pixels PX. The circuit layer 100-CL may include circuits of the pixel PX, for example, at least one thin film transistors TR1 and TR2 and at least one capacitor Cap. The circuit layer 100-CL may further include a gate driving circuit DCV disposed on one side of the non-display area NDA.

The gate lines GL and the data lines DL may respectively include a gate pad unit GL-P and data pad units DL-P which are disposed on the non-display area NDA. The gate pad unit GL-P and the data pad units DL-P may be connected to a flexible circuit board (not shown).

The device layer 100-EL includes display elements. As illustrated in FIGS. 11 and 12, the device layer 100-EL includes an organic light emitting diode OLED of the pixel PX. The device layer 100-EL may further include electronic elements assisting the organic light emitting diode.

The encapsulation layer 100-ECL seals the device layer 100-EL. The device layer 100-EL includes thin film encapsulation layers TFE, i.e., a plurality of inorganic thin films and a plurality of organic thin films. In an exemplary embodiment of the inventive concept, the encapsulation layer 100-ECL may be replaced with an encapsulation substrate. The encapsulation substrate may be disposed spaced apart from the base member 100-BS while interposing the device layer 100-EL therebetween. A sealing agent forms a predetermined space along edges of the encapsulation substrate and the base member 100-BS.

The base member 200-BS (see FIG. 3) of the touch panel 200 is disposed on the encapsulation layer 100-ECL or the encapsulation substrate. In an exemplary embodiment of the inventive concept, the first conductive layer 200-CL1 (see FIG. 3) of the touch panel 200 may be directly disposed on the encapsulation layer 100-ECL or the encapsulation substrate.

As described above, since signal lines crossing a folding axis include signal pattern including a connection line substantially parallel to the folding axis, the signal line may be prevented from being disconnected even when a crack occurs on a portion of the signal line due to repeated folding of the signal line.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A flexible display device comprising:
   a foldable area configured to be foldable about a folding axis, and a non-foldable area;
   a display panel configured to display an image; and
   a touch panel disposed on the display panel,
   wherein the touch panel comprises:
      touch sensors; and
      signal lines respectively connected to ends of the touch sensors,
   wherein at least one of the signal lines crossing the folding axis comprises:
      a first part connected to one end of a corresponding touch sensor of the touch sensors; and
      at least one signal pattern connected to the first part and disposed on the foldable area, and
   wherein the signal pattern comprises:
      sub-lines connected to the first part; and
      a connection line substantially parallel to the folding axis, spaced apart from the first part, and connecting the sub-lines to each other.

2. The flexible display device of claim 1, wherein each of the sub-lines has a shape having at least one bent portion.

3. The flexible display device of claim 2, wherein the sub-lines are symmetrical to each other about an axis that is an extending direction of at least one of the signal lines.

4. The flexible display device of claim 3, wherein the sub-lines comprise a first sub-line and a second sub-line, which are connected to each other, and the first and second sub-lines are connected to each other and form a rhombus shape.

5. The flexible display device of claim 3, wherein a range of an acute angle formed by at least one of the sub-lines and the connection line is in a range from about 10 degrees to about 30 degrees.

6. The flexible display device of claim 3, wherein the connection line is connected to a bent point of each of the sub-lines.

7. The flexible display device of claim 6, wherein the signal pattern further comprises a sub-connection line connecting the sub-lines to each other, the sub-connection line being spaced apart from the connection line at a predetermined interval and in parallel with the connection line.

8. The flexible display device of claim 6, further comprising a plurality of the signal patterns, the plurality of signal patterns being arranged in an extending direction of the signal line.

9. The flexible display device of claim 1, wherein the touch sensors comprise:
   first touch sensors; and
   second touch sensors crossing and insulated from the first touch sensors,
   wherein the signal lines comprise:
      first signal lines connected to the first touch sensors; and
      second signal lines connected to the second touch sensors, and
   wherein some of the second signal lines comprise the first part and the signal pattern.

10. The flexible display device of claim 9, wherein the first touch sensors comprise:
    first sensor patterns arranged in a first direction; and
    first connection patterns connecting two adjacent first sensor patterns to each other from among the first sensor patterns, and
    wherein the second touch sensors comprise:
      second sensor patterns arranged in a second direction crossing the first direction; and
      second connection patterns connecting two adjacent second sensor patterns to each other from among the second sensor patterns.

11. The flexible display device of claim 10, wherein the first sensor patterns and the first connection patterns are integrated with each other, the second sensor patterns and the second connection patterns are integrated with each other, and the first and second touch sensors are disposed on layers different from each other.

12. The flexible display device of claim 10, wherein the first sensor patterns and the first connection patterns have mesh shapes and the second sensor patterns and the second connection patterns have mesh shapes.

13. The flexible display device of claim 1, wherein the display panel comprises:
    a first base member;
    a circuit layer disposed on one surface of the first base member;
    an organic light emitting device layer disposed on the circuit layer; and
    an encapsulation layer configured to seal the organic light emitting device layer.

14. The flexible display device of claim 13, wherein the touch panel further comprises a second base member disposed on the encapsulation layer, and the touch sensors and the signal lines are disposed on the second base member.

15. A flexible display device comprising:
    a foldable area configured to be foldable about a folding axis extending in a direction, and a non-foldable area;
    a display panel configured to display an image; and
    a touch panel disposed on the display panel,
    wherein the touch panel comprises:
      first touch sensors and second touch sensors; and
      first signal lines and second signal lines respectively connected to ends of the first and second touch sensors,
    wherein each of the first and second signal lines comprises:
      a first part connected to a corresponding touch sensor; and
      at least one signal pattern connected to the first part and disposed on the foldable area,
    wherein the signal pattern comprises:
      sub-lines connected to the first part; and
      a connection line substantially parallel to the folding axis, spaced apart from the first part, and connecting the sub-lines to each other, and
    wherein each of the first and second sub-lines crosses the folding axis.

16. The flexible display device of claim 15, wherein each of the first and second signal lines comprises a plurality of signal patterns arranged in an extending direction of the first and second signal lines.

17. The flexible display device of claim 16, wherein the plurality of signal patterns of the first signal line and the plurality of signal patterns of the second signal line are alternately arranged to be engaged with each other.

18. The flexible display device of claim 16, wherein corresponding signal patterns from among the plurality of signal patterns of the first signal line and the plurality of signal patterns of the second signal line are disposed on the same line.

19. A flexible display device comprising:
- a foldable area configured to be foldable about a folding axis, and a non-foldable area;
- a display panel configured to display an image; and
- a touch panel disposed on the display panel,
- wherein the touch panel comprises:
    - touch sensors; and
    - signal lines respectively connected to one ends of the touch sensors,
- wherein at least one signal line crossing the folding axis of the signal lines comprises:
    - a first part connected to one end of a corresponding touch sensor from among the touch sensors; and
    - at least one signal pattern connected to the first part and disposed on the foldable area,
- wherein the signal pattern comprises:
    - a polygonal line connected to the first part; and
    - a connection line connecting one side and the other side of the polygonal line to each other and forming an angle of in a range of about 30 degrees or less with the folding axis.

* * * * *